United States Patent
Sizov

(10) Patent No.: US 10,446,675 B2
(45) Date of Patent: Oct. 15, 2019

(54) NOFF III-NITRIDE HIGH ELECTRON MOBILITY TRANSISTOR

(71) Applicant: X-FAB SEMICONDUCTOR FOUNDRIES AG, Erfurt (DE)

(72) Inventor: Victor Sizov, Dresden (DE)

(73) Assignee: X-FAB SEMICONDUCTOR FOUNDRIES AG, Erfurt (DE)

( * ) Notice: Subject to any disclaimer, the term of this patent is extended or adjusted under 35 U.S.C. 154(b) by 0 days.

(21) Appl. No.: 16/108,603

(22) Filed: Aug. 22, 2018

(65) Prior Publication Data

US 2019/0067465 A1 Feb. 28, 2019

(30) Foreign Application Priority Data

Aug. 23, 2017 (GB) .................................. 1713530.2

(51) Int. Cl.
*H01L 29/778* (2006.01)
*H01L 29/423* (2006.01)
*H01L 29/40* (2006.01)
*H01L 29/20* (2006.01)

(52) U.S. Cl.
CPC ........ *H01L 29/7786* (2013.01); *H01L 29/402* (2013.01); *H01L 29/42356* (2013.01); *H01L 29/2003* (2013.01); *H01L 29/404* (2013.01); *H01L 29/4236* (2013.01)

(58) Field of Classification Search
CPC ........... H01L 29/7786; H01L 29/42356; H01L 29/402; H01L 29/2003; H01L 29/404; H01L 29/4236
See application file for complete search history.

(56) References Cited

U.S. PATENT DOCUMENTS

| 7,898,002 | B2 | 3/2011 | Hikita et al. |
| 7,915,643 | B2 | 3/2011 | Suh et al. |
| 9,343,562 | B2* | 5/2016 | Briere ................... H01L 29/778 |
| 2007/0215899 | A1* | 9/2007 | Herman .............. H01L 27/0605 257/147 |
| 2009/0032820 | A1 | 2/2009 | Chen |
| 2013/0020614 | A1* | 1/2013 | Lu ..................... H01L 29/42316 257/194 |
| 2014/0292395 | A1 | 10/2014 | Wu et al. |
| 2014/0346525 | A1 | 11/2014 | Minoura et al. |
| 2014/0353673 | A1 | 12/2014 | Ito et al. |

FOREIGN PATENT DOCUMENTS

| EP | 2 503 693 | 9/2012 |
| WO | 2008/116038 | 9/2008 |
| WO | 2009/036181 | 3/2009 |
| WO | 2011/100304 | 8/2011 |
| WO | 2014/165034 | 10/2014 |

OTHER PUBLICATIONS

Combined Search and Examination Report dated Feb. 7, 2018 in corresponding Great Britain Application No. 1713530.2, 5 pages.

* cited by examiner

*Primary Examiner* — Dale E Page
*Assistant Examiner* — Quovaunda Jefferson
(74) *Attorney, Agent, or Firm* — Nixon & Vanderhye PC

(57) ABSTRACT

A High Electron Mobility Transistor comprising a source and a drain, a III-N buffer layer and a III-N barrier layer jointly forming a 2DEG in the buffer layer between the source and the drain, a first gate electrode configured to receive a gate bias voltage and a second gate electrode located between the drain and the first gate and conductively connected to the source via the 2DEG.

12 Claims, 4 Drawing Sheets

NOFF III-NITRIDE HIGH ELECTRON MOBILITY TRANSISTOR

This application claims priority to GB Patent Application No. 1713530.2 filed Aug. 23, 2017, the entire contents of which are hereby incorporated by reference.

TECHNICAL FIELD

The present disclosure relates to normally off (Noff; with positive threshold voltage) III-Nitride (III-N) high electron mobility transistor (HEMT) with a reduced Ron-Vbr trade off and less processing sensitive device parameters like on-resistance (Ron), threshold voltage (Vth) etc.

BACKGROUND

Robustly performing Noff devices help in simplifying electronic circuitry, in limiting power consumption of electronic circuitry and provide for less failure prone transistor performance.

Currently, all known methods of manufacturing Noff III-N based High Electron Mobility Transistors (HEMT) require additional complicate treatment or process steps during manufacture which lead to significant degradation of the transistor characteristics compared to conventional Normally-On (Non) III-N Based HEMT and/or increase the complexity of manufacture. For example, known techniques may compromise channel carrier mobility in the gate area (when compared to undisturbed two-dimensional electron gases (2DEG)) and therefore increase the on resistance (Ron) of the device.

There is therefore a need to improve the design of Noff III-N HEMTs.

BRIEF DESCRIPTION OF THE DRAWINGS

Arrangements of the present invention will be understood and appreciated more fully from the following detailed description, made by way of example only and taken in conjunction with drawings, in which.

DETAILED DESCRIPTION

Figure 1:
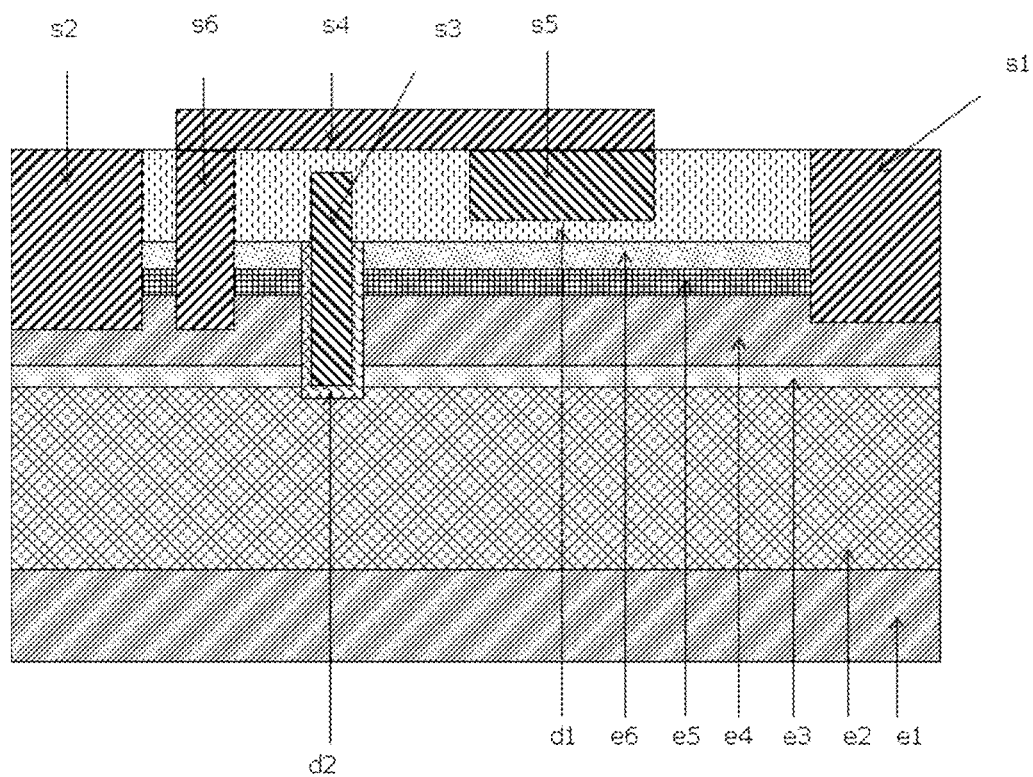
FIG. 1 shows a cross-sectional view of an embodiment of a III-N HEMT.

According to a first arrangement there is provided a HEMT comprising a source and a drain, a III-N buffer layer and a III-N barrier layer jointly forming a 2DEG in the buffer layer between the source and the drain, a first gate electrode configured to receive a gate bias voltage and a second gate electrode located between the drain and the first gate and conductively connected to the source via the 2DEG.

The first gate electrode may extend into and preferably trough the barrier layer so that forming of 2DEG below the first gate is reduced or inhibited. In this manner the 2DEG extending from the source to the first gate electrode is isolated from the 2DEG extending form the first gate electrode to the drain.

The HEMT may further comprise a conductive structure that is conductively connected to the 2DEG and located between the source and the first gate electrode.

The conductive structure may comprise a plurality of conductive columns creating a conductive connection between the 2DEG and layers of the device that are spaced apart from the 2DEG. The conductive columns may be located in a plane that is perpendicular to the source-drain direction, wherein the conductive columns are spaced apart from each other in a direction perpendicular to the source-drain direction.

The conductive structure or the conductive columns may alter the conductivity of a conductive channel formed by the 2DEG by no more than 20%, preferably no more than 10%.

Columns forming the conductive structure may be spaced apart from each other by more than twice their width. This spacing is measured in the plane containing the columns and that extends perpendicular to the source-drain direction.

The HEMT may further comprise a third gate that is conductively connected to the source.

The third gate may be located between the second gate and the drain or between the second gate and the first gate.

The second and third gates may respectively be insulated from the barrier layer by insulating structures. These insulating structures separating the respective gates from the barrier layer have one or more of different thicknesses and different HV characteristics.

Depletion of 2DEG below the first gate provides Noff characteristics to the device up to a first source-drain voltage.

The second gate can be configured, for example by an appropriate choice of gate insulator material and/or thickness, such that, at and above a first potential difference between the source and the drain, a source potential present at the second gate causes 2DEG depletion below the second gate, thereby providing Noff characteristics to the device.

Depletion of 2DEG below the first gate may provide Noff characteristics to the device up to the first potential difference between the source and the drain.

According to another aspect there is provided a device comprising any of the above described HEMTs. The device can be an AC/DC converter, a DC/DC converter, an inverter, a power supply, an AC adaptors or a motor driver or other high power devices requiring low on resistance and/or resilience to the application of high voltages.

FIG. 1 shows an embodiment of a transistor comprising a substrate e1 on which an (AL, In)GaN buffer layer including a (Al)GaN channel e2 is formed. The substrate can be a Si, Sapphire, GaN, SiC substrate or may be made of another suitable substrate material. The active area of the transistor is formed on top of the buffer layer e2 and comprises an AlN spacer layer e3, an AlGaN barrier layer e4, a GaN-cap layer e5 and SiN e6 passivation layer. The AlN layer e3, the GaN-cap layer e5 and/or the SiN passivation layer e6 are optional and one, two or all of these layers may be omitted. Thus, in one embodiment all of layers e1 to e6 are provided whereas in various other embodiments the combination of layers e3, e5 and e6, the combination of layers e3 and e5, the combination of layers e3 and e6, the combination of layers e5 and e6, or individual layer e3, e5 or e6 is omitted.

Whilst above, and also in the following, embodiments are described with reference to a (Al)GaN HEMT, the present invention is more generally applicable to any type of III-N HEMT. As used herein the terms III-Nitride or III-N relates to materials according to the stoichiometric formula $B_wAl_xIn_yGa_zN$, where w+x+y+z is about 1, 0≤w≤1, 0≤x≤1, 0≤y≤1, 0≤z≤1. What is important is that the materials used layers e2 and e4 and e3, if present, however, are such that they form a 2DEG in the buffer layer e2 as is well known to the person skilled in the art.

Returning to FIG. 1, s1 denotes the drain and s2 denotes the source of the transistor shown in FIG. 1. Two gates s3 and s5 are provided between the drain s1 and the source s2. The first gate s3 is formed by forming a complete or partial recess of AlGaN barrier layer e4 and by lining the recess with a gate dielectric d2. The gate dielectric d2 material may be Si-nitride, Si-oxide, Al-oxide or other kind of high-K materials. In one embodiment that gate is formed without dielectric (Schottky gate).

Whilst the gate s3 is shown in FIG. 1 to extend to a depth that is substantially identical to the height of an upper surface of the buffer layer e2, with the gate dielectric d2 penetrating the buffer layer e2, the exact depth to which the gate s3 and gate dielectric d2 extend is not essential. The purpose of the gate d3 is to reduce or prevent formation of 2DEG in the buffer layer e2 immediately below the gate s3. The presence of the gate s3 therefore interrupts the continuous conductivity of the 2DEG between the drain s1 and source s2, giving Noff properties to the transistor shown in FIG. 1. The properties of this gate stack, including the type of dielectric material placed under gate s3, the thickness of the gate dielectric under the gate s3, the metal used for gate s3, etc., define the threshold voltage of whole device. Choosing a metal with a lower work function for the gate, for example, increases the threshold voltage Vth if other material and architectural characteristics of the device are kept the same. Increasing the thickness and/or the dielectric constant of the dielectric will, in contrast reduce the threshold voltage Vth. The choice of dielectric material and thickness may be based on a trade of between availability, integration needs and target of Vth as will be readily apparent to the person skilled in the art. This is also true for the choice of gate metal and surface treatments of the gate.

The length of the s3 measured in the direction between drain s1 and source s2 is as short as is possible whilst still allowing to retain the device in an Off state up to a threshold voltage at or above which the application of source potential to gate s5 has depleted 2DEG below gate s5 to such a degree that the Off state of the device is achieved through this depletion. Preferably the length of the gate s3 measured in the direction between drain s1 and source s2 is, for older manufacturing processes, as short as the process used for manufacturing the device shown in FIG. 1 permits or, for newer manufacturing processes that can achieve highly resolved features, have a length that, up to the threshold, prevents breakdown or charge leakage below the gate. It will be appreciated that the interruption of the 2DEG created by the presence of gate s3 does not only give Noff properties to the device but also creates a conductivity gap that needs to be crossed by charges during ON operation. It will consequently be appreciated that the presence of gate s3 increases the ON resistance Ron of the device shown in FIG. 1. By minimising the length of the gate s3 measured in the direction between drain s1 and source s2 the effect the presence of the gate s3 has on Ron is minimised. The gate s3 still provides Noff behaviour to the transistor for low voltages being applied between the drain s1 and the source s2. Gate s3 does not have to provide high voltage (HV) capability to the device shown in in FIG. 1, as this capability is provided by the second gate, gate s5.

As can be seen from FIG. 1, the second gate s5 does not extend down to buffer layer e2, or even into the passivation layer e6 and is instead separated from the passivation layer e6 by a dielectric layer d1. The material of the dielectric layer d1 is selected from the list of materials provided above for d2. The architecture of gate s5 on its own therefore does not disturb 2DEG below the gate s5 during ON condition. Gate s5 on its own would consequently provide Non characteristics. Whilst an under gate dielectric can be used below gate s5 doing so is optional. In the architecture shown in FIG. 1 this is because the gate s5 is surrounded by the SiN passivation layer e6. The thickness of any insulating layer below the gate s5, be that the thickness of the passivation layer e6, the thickness of a gate dielectric placed under the gate s5 or a combination of these two thicknesses directly influences the HV capabilities of the device and defines the requirements for the minimum Noff capability of gate s3. The length of s5 measured in the direction between the drain s1 and the source s2 can be chosen to allow for a desired HV operation. The choice of this length of the gate s5 does not affect Ron because the gate architecture does not disturb the formation of 2DEG below the gate. It is within the skill of the person skilled in the art to provide the cascaded device shown in FIG. 1 with a gate s5 that is dimensioned and spaced from the closest conducting structures so that the device has a desired high voltage capability.

Further provided in the device shown in FIG. 1 is a contact s6 that is located between the source s2 and the gate s3 and that is conductively connected to the gate s5 via a conductive layer s4. In one embodiment the conductive layer s4 is a metal layer. The contact s6 extends into the AlGaN barrier layer e4 to a depth that provides a conductive connection to the 2DEG below the contact s6. In some embodiments this causes a decrease or even interruption in 2DEG below the contact s6.

It will be appreciated that the presence of gate s3 segments the 2DEG between the drain s1 and the source s2 into two distinct parts, respectively located on the drain and source sides of the gate s3. The source s2 and the contact s6 are both located within one of these two 2DEG segments and are conductively connected to each other via the 2DEG. This in turn means that the gate s5 is conductively connected to the source s2 through the metal layer s4, contact s6 and the 2DEG connecting contact s6 to source s2. The potential of the gate s5 is therefore the same as the potential applied to the source s2.

Turning now to the operation of the device shown in FIG. 1, the Noff capabilities of the device are ensured over a device specific range of potential difference between the drain s1 and the source s2. The Noff capability of the device shown in FIG. 1 is provided by two different mechanisms over this range. For low potential differences between the drain s1 and the source s2, up to a first voltage, the above discussed 2DEG depletion by gate s3 provides the Noff characteristic to the device shown in FIG. 1 by rendering the buffer layer e2 below the gate s3 non-conductive. The first voltage in one embodiment is one tenth of the total rated voltage of the device. More generally, the device is configured so that, when the first voltage is reached, depletion below the gate s5 is sufficient to render the channel below the gate s5 non-conductive. The properties of the gate s3 also define the threshold voltage of the device shown in FIG. 1.

For higher potential differences between the drain s1 and the source s2 the potential of the gate s5 remains at the potential of the source s2 through the connection of the gate s5 with the source s2. The potential of the 2DEG located between the gate s3 and the drain s1, however, is the same as the potential applied to the drain s1, through the conductive connection of the drain s1 to the 2DEG under the gate s5. The potential difference between the gate s5 and the 2DEG below the gate s5 consequently increases with increasing potential difference between the drain s1 and the source s2.

The gate s5 is configured so that, when the potential difference between the drain s1 and the source s2 is sufficiently high to overcome the Noff properties provided by the gate s3 this potential difference is also high enough to have depleted the charges in the 2DEG below the gate s5. For higher source-drain potential differences the 2DEG below gate s5 has consequently been depleted, so that for such higher voltages Noff characteristics are thereby provided, even though the architecture of the gate s3 alone would not be sufficient for providing Noff properties at high voltage. As the potential difference between the drain s1 and source s2 increases depletion of then 2DEG increases, thus continuing to guarantee Noff behaviour, up to the limit of the EPI buffer capability.

If a positive bias is applied to the gate s3 the channel below the gate s3 is rendered conductive/opened. This removes the potential difference between the gate s5 and the 2DEG, thereby preventing the above discussed depletion of the 2DEG. As a consequence the entire channel is rendered conductive.

It is of importance that the ON resistance Ron of the entire device is affected as little as possible by the device's architecture. One consideration pertinent to this is the length of the gate s3 measured in the source-drain direction, as discussed above. It will be appreciated that the architecture of the contact s6 shown in FIG. 1 can also influence Ron and it is therefore desirable to structure the contact s6 such that it affects Ron to the smallest degree possible.

Figure 2A:
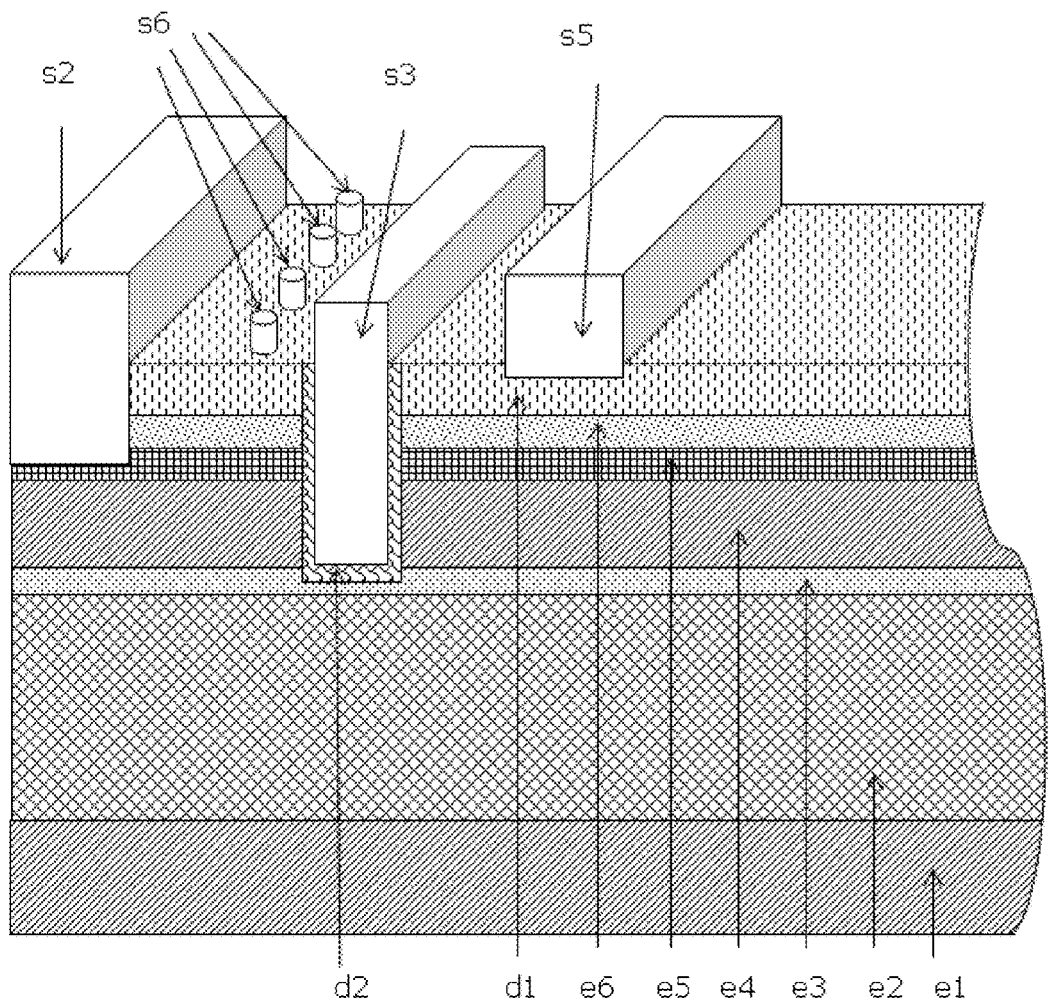
FIG. 2A shows a perspective view of details of a contact of the embodiment of FIG. 1 with some components shown in FIG. 1 omitted for clarity.

FIG. 2A illustrates one embodiment that is structurally similar to the embodiment shown in FIG. 1 but in which the configuration of the contact s6 is shown in more detail. As can be seen from FIG. 2A, the contact s6 does not have a continuous structure in the plane orthogonal to the source-drain direction. Instead the contact s6 is provided as a set of discrete parallel semiconductor columns that extend downward from the metal layer s4 to conductively connect the metal layer s4 (and with it the gate s5) to the source s2 via the 2DEG below the contact s6. By rendering the contact s6 discontinuous in the direction orthogonal to the source-drain direction the contact s6 cannot disturb the formation of 2DEG below it over the entire width of the drain s2 and/or the gate s3 in the direction orthogonal to the source-drain direction, even if the individual columns of the contact s6 were to extend to a depth within the barrier layer e4 that can locally inhibit the formation of 2DEG below individual columns. This means that, even if the formation of 2DEG below the contact s6 was disturbed by the presence of the contact s6 such disturbance would still leave intact 2DEG channels extending from the drain s2 to the gate s3 in areas that do not have a column of contact s6 above them. Using a column structure for the contact s6 therefore reduces the precision required in limiting the depth to which the contact s6 extends in the device. This in turn makes the manufacturing requirements for the device less onerous and less costly.

Figure 2B:
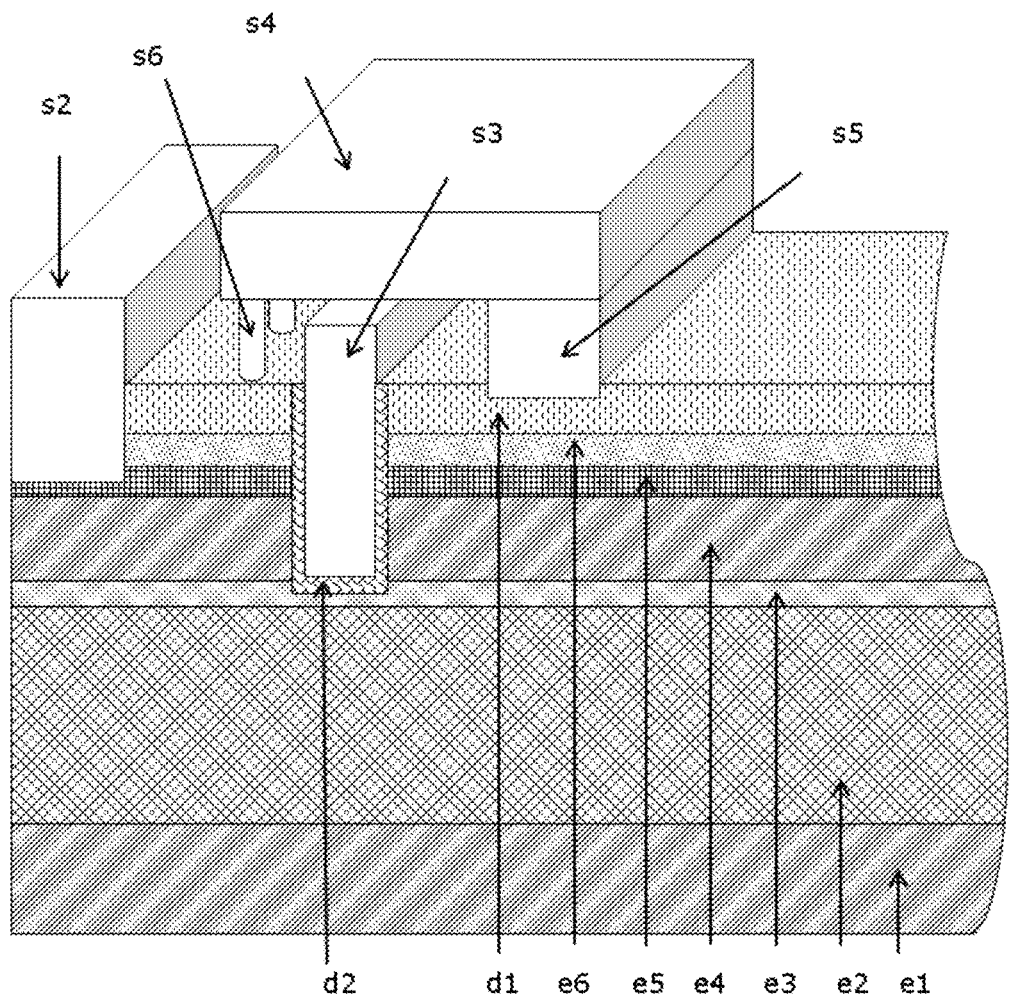
FIG. 2B shows the perspective view of FIG. 2A but including further detail.

FIG. 2B further illustrates that, as will already have been appreciated, the conductive columns that form contact s6 extent in an upward direction so that they are conductively connected to the metal layer s4 (which has been omitted from FIG. 2A to improve the clarity of this FIG. 2A).

Figure 3A:
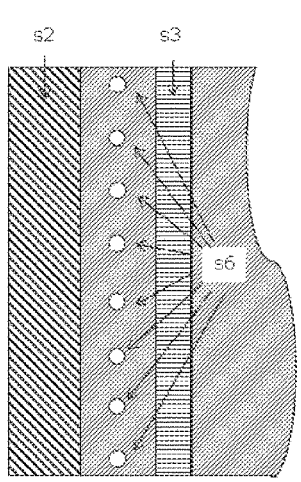
FIG. 3A shows a first configuration of contacts.
Figure 3B:
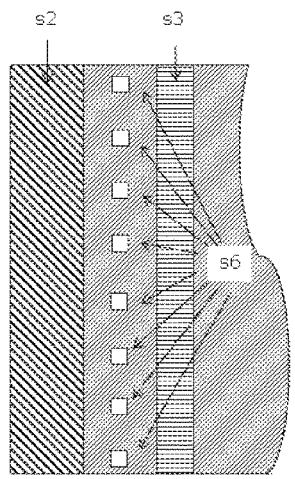
FIG. 3B shows a second configuration of contacts.
Figure 3C:
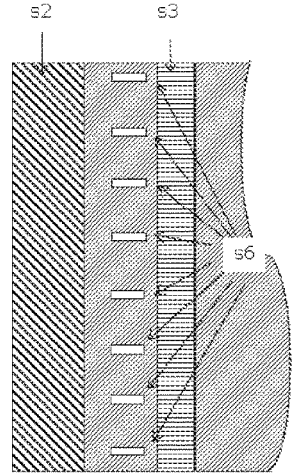
FIG. 3C shows a third configuration of contacts.

FIG. 3A, FIG. 3B and FIG. 3C show horizontally cut top plan views of embodiments of a transistor wherein the cut plane extends through the buffer layer e4. As can be seen from these figures, the conductive columns that make up contact s6 can have various cross-sections, including a circular cross-section, as shown in FIG. 2A, FIG. 2B and FIG. 3A, a square cross-section, as shown in FIG. 3B or a rectangular cross-section, as shown in FIG. 3C. To minimise any reduction of conductivity by the 2DEG below the contact s6 the long sides of the rectangular cross-section of the columns shown in FIG. 3C extend in the source-drain direction whilst the short sides of the columns shown in FIG. 3C extend in the direction orthogonal to the source-drain direction. The person skilled in the art will be able to balance the desire to minimize disturbance of 2DEG (and therefore to minimise any increase in Ron) by reducing the overall surface area occupied by the columns of the contact s6 in horizontal cross-section whilst selecting the cumulative cross-section of the columns of the contact s6 to maintain a conductive connection of the 2DEG below the contact s6 and the gate s5 that is sufficient to allow the potential of gate s5 to mirror that of the source s2 so that depletion of the 2DEG below gate s5 is possible in the above discussed manner.

Figure 4:
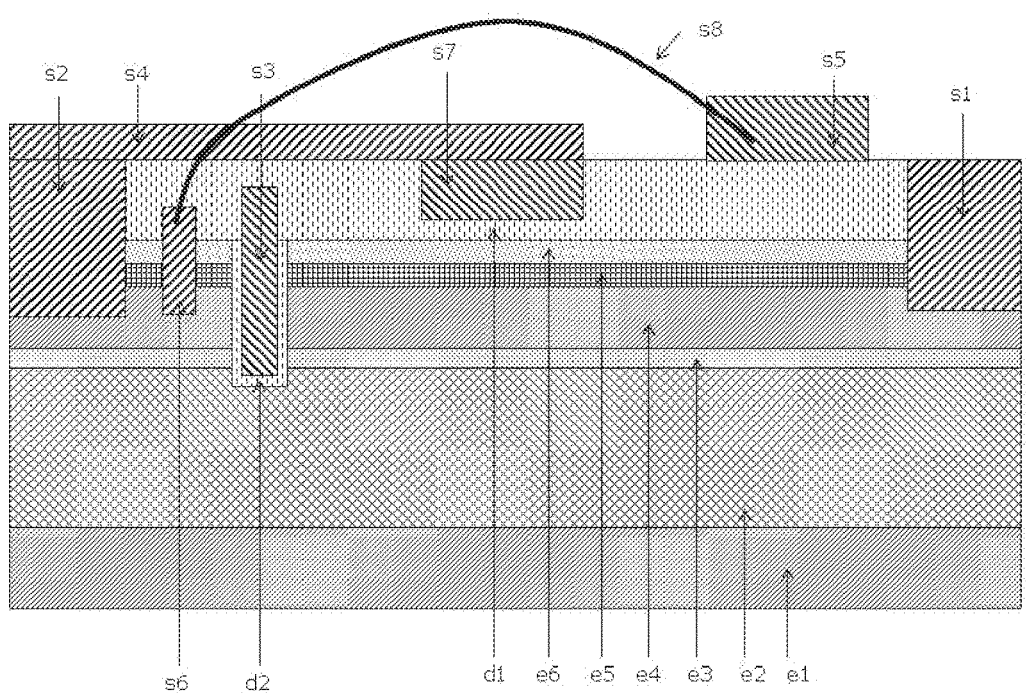
FIG. 4 shows a further embodiment.

FIG. 4 shows another embodiment of the invention. As can be seen, contact s6 as well as gate s5 are provided in the same manner as in the above discussed embodiments. The function provided by the field plate s4 in FIGS. 1 to 3 is provided by the conductive connection s8 in the embodiment of FIG. 4. In addition to the component discussed thus far, the device shown in FIG. 4 further comprises a gate s7 that is connected to the source s2 via field plate s4. As will be appreciated, the embodiment shown in FIG. 4 comprises two gates, gates s5 and s7 that are conductively connected to the source, with gate s5 being conductively connected to source s2 via conductive line s8, contact s6 and the 2DEG extending between the lower end of conduct s6 and the source s2 and gate s7 being directly connected to the source s2 through conducting field plate s4. It will be appreciated that conductive line s8 is routed around/insulated from any conducting structures it is not shown as being connected to, including field plate s4. The structure shown in FIG. 4 provides the additional advantage of flexibility in the design and placement of the gates s5 and s7. As can in particular be seen the distance of the gate s5 from the barrier layer e4 is larger than the distance of gate s7 from barrier layer e4. The manner in which the two gates s5 and s7 affect the 2DEG and therefore the HV properties of the device are different and the design and placement of the two gates can therefore be used to adjust the HV properties of the device.

All of the above described embodiments can be manufactured using standard CMOS foundry equipment and include comparatively simply manufacturing processes. They do, moreover, not rely on the use of any special customised EPI material and allow robust selection and control of the threshold voltage of the manufactured devices. As discussed above, the architecture of the gate s3 prevents the forming of 2DEG below it. The depth to which s3 extends does hereby not have to be controlled accurately so that it is not necessary to use highly accurate etch stop methods. This renders the manufacturing processes less onerous and more financially attractive.

The design and positioning of the gate s5 moreover does not affect threshold voltage, on resistance Ron or off-state gate leakage of the device whilst it allows to retain excellent HV performance. These properties can be controlled through the design of the gate s3. The gate s7 further improves HV capability of the gate s5, so the gate s5 may be extremely short when measured in the direction between the source s2 and drain s1 and when compare to a two gate solution, such as the solutions shown in FIGS. 1, 2A and 2B.

The reduction of Ron by the device in particular is minimal whilst off-state gate leakage is considerably improved when compared to conventional solutions. Known arrangements comprising a p-(Al)GaN gate, for example, have the limitation that, to achieve an Noff condition the 2DEG concentration has to be so low that the p-GaN can deplete 2DEG. This leads to relatively high sheet resistance of 2DEG and hence higher Ron of the final device. For example, typical sheet resistance for 2DEG is about 300 ohm/sq, while p-GaN gate structures can have sheet a resistance of 500 ohm/sq. In additional to that, no dielectric is used between metal and p-(Al)GaN gates to achieve the desired Noff condition. Consequently hence much higher gate leakage occurs in such arrangements. Embodiments of the present invention in contrast can achieve lower 2DEG sheet resistance whilst achieving low gate leakage by avoiding the use of p-GaN gates altogether.

Known arrangements comprising conventional recess gate solution need to employ large gate length (this can be as high as 2-3 μm) to create a HV capable gate. This, however, results in increased ON resistance Ron avoided by embodiments of the present invention.

As the design and function of gates s3 and s5 can be separated from each other one of the limitations of other proposals to achieve Noff behaviour for HEMTs, the need to design gate insulating layers to render them HV capable, is overcome by the embodiments.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope of the inventions.

The invention claimed is:

1. A HEMT comprising:
    a source and a drain;
    a III-N buffer layer and a III-N barrier layer jointly forming a 2DEG in the buffer layer between the source and the drain;
    a first gate electrode configured to receive a gate bias voltage;
    a second gate electrode located between the drain and the first gate and conductively connected to the source via the 2DEG.

2. A HEMT according to claim 1, wherein the first gate electrode extends into and preferably trough the barrier layer so that forming of 2DEG below the first gate is reduced or inhibited.

3. A HEMT according to claim 1, further comprising a conductive structure conductively connected to the 2DEG and located between the source and the first gate electrode.

4. A HEMT according to claim 3, wherein the conductive structure comprises a plurality of conductive columns creating a conductive connection between the 2DEG and layers of the device spaced apart from the 2DEG.

5. A HEMT according to claim 3, wherein the conductive structure alters the conductivity of a conductive channel formed by the 2DEG by no more than 20%, preferably no more than 10%.

6. A HEMT according to claim 3, wherein columns forming the conductive structure are spaced apart from each other by more than twice their width.

7. A HEMT according to claim 1, further comprising a third gate, the third gate conductively connected to the source.

8. A HEMT according to claim 7, wherein the third gate is located between the second gate and the drain or between the second gate and the first gate.

9. A HEMT according to claim 8, wherein second and third gates are respectively insulated from the barrier layer by insulating structures, wherein the insulating structures separating the respective gates from the barrier layer have one or more of different thicknesses and different HV characteristics.

10. A HEMT according to claim 1, wherein a depletion of 2DEG below the first gate provides Noff characteristics to the device up to first potential difference between the source and the drain.

11. A HEMT according to claim 10, wherein the second gate is configured such that, for a potential difference between the source and the drain that is equal to or higher than the first potential difference a source potential present at the second gate causes 2DEG depletion below the second gate, thereby providing Noff characteristics to the device at and above the first potential difference.

12. A device comprising a HEMT according claim 1, wherein the device is an AC/DC converter, a DC/DC converter, an inverter, a power supply, an AC adaptors or a motor driver.

* * * * *